United States Patent
Blatz et al.

(10) Patent No.: US 7,633,422 B2
(45) Date of Patent: Dec. 15, 2009

(54) TRANSDUCER DEVICE

(75) Inventors: Werner Blatz, Leingarten (DE); Robert Dvorszky, Heilbronn (DE); Ulrich Grosskinsky, Neudenau (DE); Lourans Samid, Heilbronn (DE); Marco Schwarzmueller, Heilbronn (DE)

(73) Assignee: Atmel Automotive GmbH, Heilbronn (DE)

( * ) Notice: Subject to any disclaimer, the term of this patent is extended or adjusted under 35 U.S.C. 154(b) by 0 days.

(21) Appl. No.: 12/120,659

(22) Filed: May 15, 2008

(65) Prior Publication Data

US 2008/0284635 A1     Nov. 20, 2008

Related U.S. Application Data

(60) Provisional application No. 60/939,845, filed on May 23, 2007.

(30) Foreign Application Priority Data

May 15, 2007   (DE) .................. 10 2007 022 998

(51) Int. Cl.
    *H03M 1/34*   (2006.01)
(52) U.S. Cl. ...................... 341/158; 367/123
(58) Field of Classification Search .......... 341/144–160
    See application file for complete search history.

(56) References Cited

U.S. PATENT DOCUMENTS 5,010,334 A * 4/1991 Ponzio .................. 340/870.28
5,327,132 A    7/1994 Whitecar et al.
5,362,960 A * 11/1994 Komatsu et al. ......... 250/214.1
5,451,947 A    9/1995 Morrison
5,825,240 A   10/1998 Geis et al.
6,124,812 A    9/2000 Scheidig
6,628,123 B2 * 9/2003 Raffalt et al. ................ 324/522
2004/0057534 A1 3/2004 Masenten et al.
2004/0201508 A1 10/2004 Krone et al.
2005/0083996 A1 4/2005 Robinson et al.

FOREIGN PATENT DOCUMENTS

DE      198 00 775 A1    7/1999

* cited by examiner

*Primary Examiner*—Lam T Mai
(74) *Attorney, Agent, or Firm*—Muncy, Geissler, Olds & Lowe, PLLC

(57) ABSTRACT

A transducer device for converting an analog DC voltage signal into a digital signal is provided, with an oscillator device for outputting a first oscillator signal and a second oscillator signal, whereby the oscillator device is formed to generate the first oscillator signal and the second oscillator signal phase-locked to one another and with the substantially same frequency from a reference signal, with an analog frequency converter connected to the oscillator device for transforming the analog DC voltage signal by the first oscillator signal in a first spectral range with a first center frequency to obtain a transformed signal, with an analog-to-digital converter for converting the transformed signal into a transformed digital signal; and with a digital frequency converter connected to the oscillator device for transforming the transformed digital signal by means of the second oscillator signal in a second spectral range with a second center frequency to obtain the digital signal.

13 Claims, 4 Drawing Sheets

TRANSDUCER DEVICE

This nonprovisional application claims priority to German Patent Application No. DE 10 2007 022 998.6, which was filed in Germany on May 15, 2007, and to U.S. Provisional Application No. 60/939,845, which was filed on May 23, 2007, and which are both herein incorporated by reference.

BACKGROUND OF THE INVENTION

1. Field of the Invention

The present invention relates to the field of analog-to-digital conversion.

2. Description of the Background Art

An audio system for an analog audio source is known from U.S. Pat. No. 5,327,132. An audio signal is an alternating current signal with a typical frequency response of 20 Hz to 20 KHz. In conventional analog-to-digital converters, amplifiers, for example, suitably wired operational amplifiers, are often used for signal amplification. Often a DC voltage measuring signal, such as, e.g., a temperature signal, is required as a digital signal; it is to be converted into a digital signal for detection or further processing.

SUMMARY OF THE INVENTION

It is an object of the invention to provide an improved conversion concept.

A transducer device for converting an analog signal, preferably a DC voltage signal, into a digital signal is provided.

The transducer device has an oscillator device, which can be formed to output a first oscillator signal and a second oscillator signal. The oscillator device can be formed to generate a first oscillator signal and a second oscillator signal phase-locked to one another and with same a frequency from a reference signal. The reference signal in this case is not the first or second oscillator signal, but the reference signal is different from the first and second oscillator signal. The reference signal preferably can be generated by a reference unit, such as, for example, an oscillating crystal.

The transducer device has an analog frequency converter for transforming the analog (DC voltage) signal. The analog frequency converter is preferably connected to the oscillator device. The analog frequency converter is formed to transform the analog (DC voltage) signal in a first spectral range with a first center frequency to obtain a transformed signal. The transformation occurs preferably by means of the first oscillator signal. The analog frequency converter can be, for example, an analog mixer, which can also be complex-valued.

The transducer device has an analog-to-digital converter for converting the transformed signal into a transformed digital signal. The analog-to-digital converter can be a conventional converter, e.g., a sigma-delta converter.

The transducer device has a digital frequency converter for transforming the transformed digital signal in a second spectral range with a second center frequency to obtain the digital signal. It is also preferable that the digital frequency converter is connected to the oscillator device to effect the transformation by means of the second oscillator signal. The digital frequency converter can be, for example, a digital mixer, which is connected downstream of the analog-to-digital converter and can be complex-valued.

Another aspect of the invention is a method for converting an analog signal, preferably a DC voltage signal, into a digital signal.

In the method, a first oscillator signal is generated by means of an oscillator device and a second oscillator signal from a reference signal different from the first and second oscillator signal. The first oscillator signal and the second oscillator signal are phase-locked to one another and have a same frequency. Preferably, the phases of both signals are identical.

In the method, the analog DC voltage signal is transformed by means of an analog frequency converter, connected to the oscillator device, depending on the first oscillator signal in a first spectral range with a first center frequency to obtain a transformed signal.

The transformed signal is converted by an analog-to-digital converter into a transformed digital signal.

The transformed digital signal is transformed by a digital frequency converter connected to the oscillator device depending on the second oscillator signal in a second spectral range with a second center frequency to obtain the digital signal.

Another aspect of the invention is the use of an oscillator device, an analog frequency converter of an analog-to-digital converter, and a digital frequency converter for converting an analog signal into a digital signal.

The invention is based on the realization of transforming the analog signal to be converted before the conversion in a frequency range in which the noise effect is lower than in the frequency range occupied by the analog signal to be converted.

An embodiment provides that the reference signal can have a higher frequency than the first and second oscillator signal—particularly an integer multiple of the frequency of the first and second oscillator signal. Preferably, a frequency divider is provided, which generates the first and/or second oscillator signal by means of frequency division.

An embodiment provides that the signal values of the second oscillator signal within a period of the second oscillator signal approximately can depict a sine or cosine form. Preferably, the first oscillator signal has a rectangular form and is formed, for example, by division from the reference signal.

The transducer device can have a number of digital filters connected to the digital frequency converter to form a filtering of an analog 1/f noise of the analog-to-digital converter, for example, an amplifier of the analog-to-digital converter.

An embodiment provides that the digital frequency converter can have a first digital mixer to apply an in-phase part of the second oscillator signal and a second digital mixer to apply a quadrature-phase part of the second oscillator signal. The analog frequency converter has a first analog mixer to apply a first signal part of the first oscillator signal with the same phase position as the in-phase part of the second oscillator signal and a second analog mixer to apply a second signal part of the first oscillator signal with same phase position as the quadrature-phase part of the second oscillator signal. Advantageously, switches are provided for switching the first signal part and/or the second signal part of the first oscillator signal also to additional analog mixers.

According to an embodiment, the second center frequency is substantially the same or the same as the first center frequency. According to another embodiment, the second center frequency can be a multiple of the first center frequency, for example, double the first center frequency. In this case, the signal is shifted into a higher frequency range, whereby the baseband component (image spectrum) can be detected by a lowpass filter.

According to another embodiment, the digital signal is placed in a third spectral range with a third center frequency, for example, in the baseband. In this case, the difference between the second center frequency and the third center frequency may be smaller than the difference between the first center frequency and the third frequency. For this purpose, the transformed digital signal can be shifted again, for example, into the original frequency position. According to an embodiment, the second and third center frequencies are the same and lie within the baseband, e.g., at the frequency zero.

According to another embodiment, the digital frequency converter is, for example, a complex baseband mixer with a downstream lowpass filter.

According to another embodiment, the analog-to-digital converter comprises an amplifier with a frequency-dependent noise characteristic, whereby the second center frequency is not smaller than the double corner frequency (or cutoff frequency) of the frequency-dependent noise characteristic.

According to another embodiment, a decimation filter is connected downstream of the analog-to-digital converter. Preferably, a corner frequency of the decimation filter can be set by a control unit. The digital frequency converter preferably fulfills two functions: on the one hand, it shifts the transformed digital signal, for example, back into the original frequency position and, on the other, it is used for frequency conversion for the sampling rate conversion.

According to another embodiment, a decimation filter unit is connected downstream of an analog-to-digital converter that has the digital frequency converter as an integral component. In this case, the concept of the invention can be realized especially advantageously.

According to another embodiment, the transducer device comprises a signal generator for generating the analog signal. The analog signal is preferably a DC voltage signal. The analog signal can be, e.g., a temperature signal whose voltage value is proportional to a temperature. The analog signal can be, e.g., a PTAT signal (PTAT: Proportional to Absolute Temperature). The signal generator can be formed further to measure the temperature and to output a temperature signal, which indicates the measured temperature.

According to another embodiment, the transducer device comprises further a switch for switching an output of the analog frequency converter to an input of the analog-to-digital converter. The switch can be formed, for example, in a first switch position to switch the output of the analog frequency converter to the input of the analog-to-digital converter and in a second switch position to switch the other terminal to the input of the analog-to-digital converter, whereby a transmitted signal, particularly an up-mixed signal, or a received signal, particularly a down-mixed signal, can be applied at the other terminal. Thus, in the first switch position, for example, only the output signal of the signal generator is transformed by means of the analog frequency converter, whereas in the second switch position, e.g., the received signal is supplied directly to the analog-to-digital converter.

It is provided according to an embodiment that the transducer device has a number of digital filters connected to the digital frequency converter. Furthermore, the transducer device has a control unit, which is set up for setting corner frequencies of the respective filter, said frequencies dependent on the first switch position or the second switch position.

According to another embodiment, a lowpass filter is connected downstream of the digital frequency converter in order to detect, for example, an image spectrum-baseband signal, to obtain the digital signal.

According to another aspect, the invention provides a receiving device with the transducer device described heretofore. In this case, a received signal can be applied at an input of the analog-to-digital converter.

According to another aspect, the invention provides a receiving method with the steps of the method of the invention for conversion, whereby a received signal is transformed in addition either in the first spectral range or forms the transformed signal or is converted directly, to obtain the digital signal. Other process steps result directly from the functionality of the receiving device.

According to another aspect, the invention provides a program for performing at least one of the methods described heretofore, when the program runs on a computer of an arithmetic logic unit.

According to another aspect, the invention provides a data processing device, which is set up by programming to allow the program described heretofore to perform the steps of at least one of the methods described heretofore.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
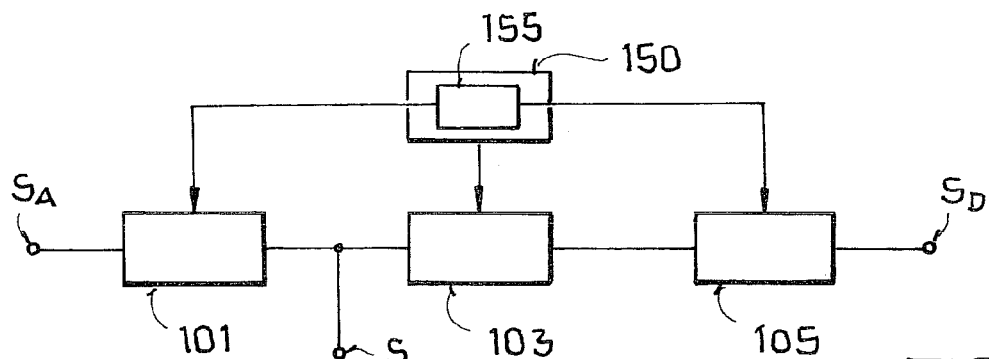
FIG. 1 shows a schematic block diagram of a transducer device.

FIG. 1 shows a transducer device for converting an analog DC voltage signal $s_{A1}$, which can be applied at an input of an analog frequency converter 101, into a digital signal. The transducer device comprises an analog-to-digital converter 103, which is connected downstream of analog frequency converter 101, and a digital frequency converter 105, which is connected downstream of analog-to-digital converter 103, and supplies a transformed digital signal $s_D$.

Analog frequency converter 101 (e.g., an analog mixer) shifts the analog signal into the frequency range, for example, by a frequency interval that corresponds to the double corner frequency of an amplifier used in analog-to-digital converter 103. The transformed signal therefore lies in a frequency range, less affected, for example, by 1/f noise of the amplifier than the original frequency range (0 Hz to several Hz) of the analog DC voltage signal. Analog-to-digital converter 103 converts the signal shifted in the frequency range into a transformed digital signal and supplies it to digital frequency converter 105 (e.g., a digital mixer).

Digital frequency converter 105 shifts the transformed digital signal, for example, by the same frequency interval in the direction of higher frequencies to obtain an image frequency part at the original frequency position of the analog DC voltage signal $s_A$. To detect this component, a lowpass filter can be provided connected downstream of digital frequency converter 105. Alternatively, digital frequency converter 105 can again shift the transformed digital signal back to the original frequency position, e.g., into the baseband position.

Furthermore, a control unit 150 is provided, which controls, for example, the analog-to-digital converter 103. For example, the sampling frequency of the analog-to-digital converter 103 can be controlled by control unit 150. A received signal s, which can be converted by analog-to-digital converter 103, can be applied at the analog-to-digital converter 103 optionally to the transformed analog DC voltage signal $s_A$. After an analog-to-digital conversion, the received signal s is shifted by digital frequency converter 105 into a baseband and, for example, demodulated by a demodulator.

In the exemplary embodiment of FIG. 1, moreover, an oscillator device 155 is provided, which outputs a first oscillator signal for analog frequency converter 101 and a second oscillator signal for digital frequency converter 105. Both oscillator signals have the same frequency and phase. In contrast, the amplitude shape of the first oscillator signal and the second oscillator signal is different.

Figure 2:
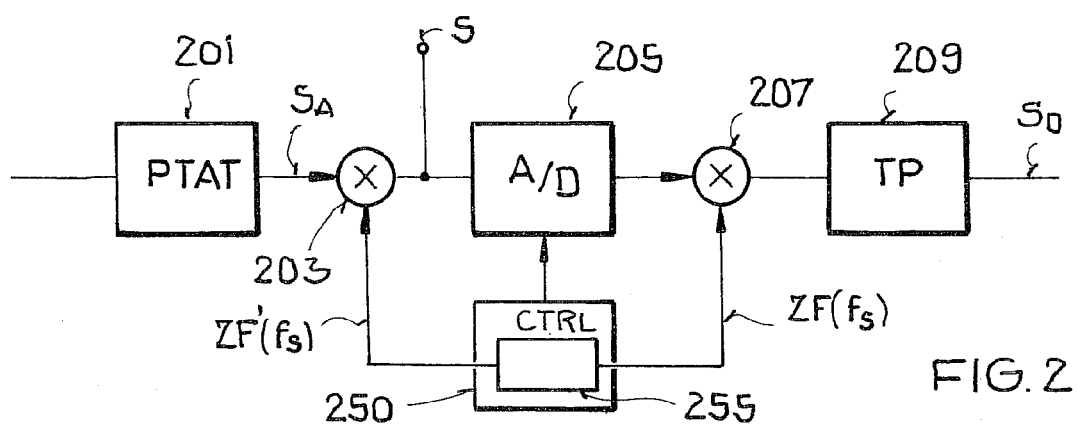
FIG. 2 shows a schematic block diagram of a transducer device.

FIG. 2 shows a transducer device with a signal generator 201 (PTAT) with a downstream analog mixer 203. An output of analog mixer 203 is coupled to an input of an analog-to-digital converter 205 (A/D).

A digital mixer 207, whose output is connected to an input of a lowpass filter 209 (TP), is connected downstream of analog-to-digital converter 205.

Signal generator 201 generates, for example, a PTAT signal, which is transformed by analog mixer 203, e.g., by a frequency fs. For this purpose, an oscillator device 255 is provided, which is connected to analog mixer 203 and which generates a first oscillator signal ZF'(fs) with the frequency fs from a reference signal and applies it at mixer 203. The transformed signal is converted by analog-to-digital converter 205 in an analog-to-digital manner and is again shifted by digital mixer 207 by the same frequency fs in the frequency range. For this purpose, oscillator device 255 is connected to digital mixer 207 and outputs a second oscillator signal ZF(fs) with the frequency fs to digital mixer 207. Oscillator device 255 is formed to output the first oscillator signal ZF'(fs) and the second oscillator signal ZF(fs) phase-locked to one another. Lowpass filter 209 is provided optionally to detect the baseband component of the output signal of digital mixer 207. Furthermore, a control unit 250 (CTRL) is provided for controlling analog-to-digital converter 205 and at least one corner frequency of filter 209.

The exemplary embodiment of FIG. 2 has the advantage that the noise effect can be reduced by external wiring of analog-to-digital converter 205, without the converter structure having to be modified significantly. The exemplary embodiment of FIG. 2 can use especially preferably a sigma-delta converter.

Figure 3:
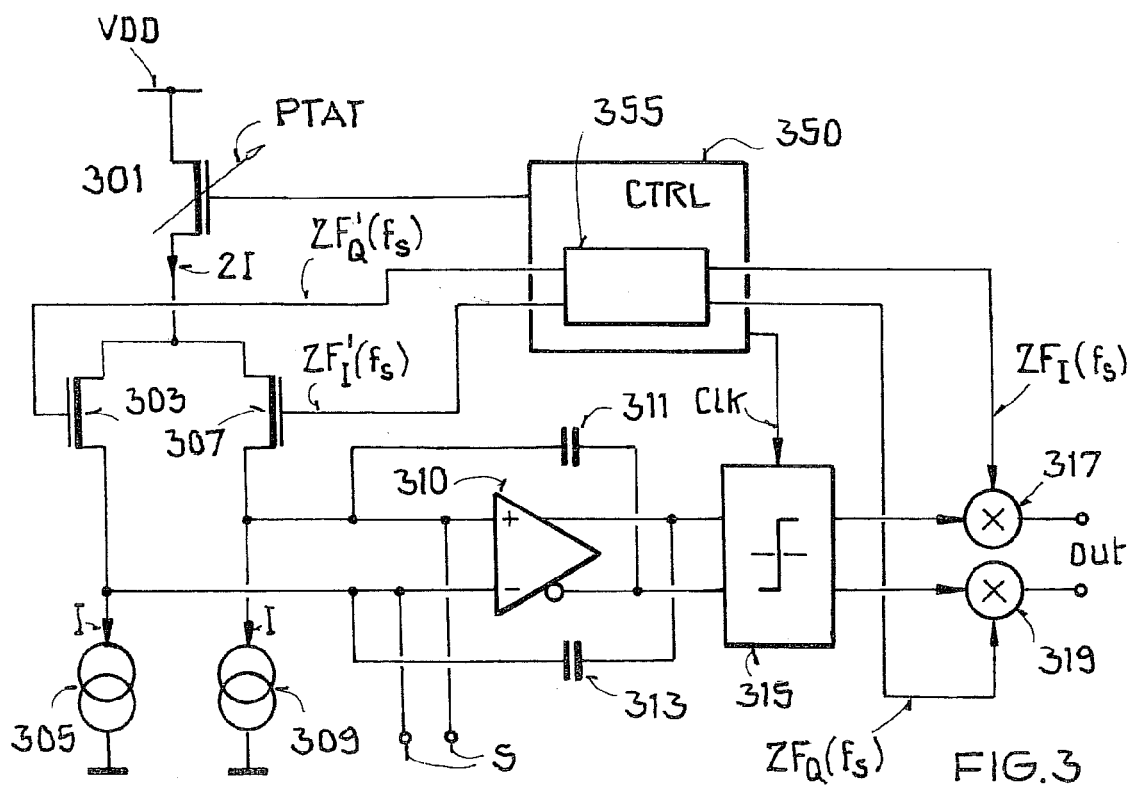
FIG. 3 shows a schematic circuit diagram of a transducer device.

FIG. 3 shows a circuit diagram of a transducer device with a transistor 301 with a downstream analog mixer circuit comprising a first transistor 303, a current source 305 connected downstream of first transistor 303, a second transistor 307, and a second current source 309 connected downstream of second transistor 307. Both transistors 303, 307 can be, e.g., field-effect transistor of a different conductivity type. Transistor 307 is connected to a first input of an operational amplifier 310, as shown in FIG. 3. Transistor 303 is connected to a second input of operational amplifier 310. A first output of operational amplifier 310 is connected via a capacitor 311 to its first input. A second output of operational amplifier 310 is connected via a capacitor 313 to its second input. Both outputs of operational amplifier 310 are connected to the inputs of a detector 315, which can be, for example, a threshold value detector. Detector 315 comprises two outputs, each of which is connected to a digital mixer 317 or 319, with supplies the digital output signal $s_D$.

The voltage Vdd can be applied, for example, at first transistor 301. The transistor can be controlled by control unit 350 and depending on a control signal that can be applied at its control input supplies, e.g., a PTAT signal of the current strength 21, each current source supplying a current I. An oscillator device 355 is provided, which outputs a first oscillator signal $ZF'_Q(fs)$, $ZF'_I(fs)$ and a second oscillator signal $ZF_Q(fs)$, $ZF_I(fs)$. The second oscillator signal here has an in-phase part $ZF_I(fs)$ and a quadrature-phase part $ZF_Q(fs)$, which are phase-shifted by 90°. A first part $ZF_I'(fs)$ of the first oscillator signal has the same phase as the in-phase part $ZF_I(fs)$ of the second oscillator signal and is phase-locked relative to it. A second part $ZF_Q'(fs)$ of the first oscillator signal has the same phase as the in-phase part $ZF_Q(fs)$ of the second oscillator signal and is phase-locked relative to it. The parts $ZF'_Q(fs)$, $ZF'_I(fs)$ of the first oscillator signal, which, for example, represent an intermediate frequency fs or form it in the form of an oscillation, can be applied at the control inputs of transistors 303 and 307, which are provided for the analog frequency conversion.

The transformed signal is converted in an analog-to-digital manner by amplifier 310 and detector 315 controlled by control unit 350 by the clock signal clk, and transformed by digital mixers 317, 319, in another spectral range. The in-phase part $ZF_I(fs)$ and the quadrature-phase part $ZF_Q(fs)$ of the second oscillator signal, which represent, for example, the aforementioned intermediate frequency fs or form it in the form of an oscillation, can be applied at digital mixers 317 and 319.

According to the invention, for example, a temperature signal representing a temperature is modulated with the frequency fs, converted analog-to-digital, and shifted digitally again to DC voltage values (DC). The analog-to-digital conversion can therefore be used for data, e.g., RKE (Remote Keyless Entry), and for a sensor (temperature sensor, pressure sensor). In the exemplary embodiment of FIG. 3, it is therefore no longer necessary that analog components must switch. This results in a reduction of power consumption, because no analog filters are used after the mixer, as well as in a reduction of the (chip) area necessary for the analog-to-digital converter 315, because additional analog components and filters are not required.

Figure 4:
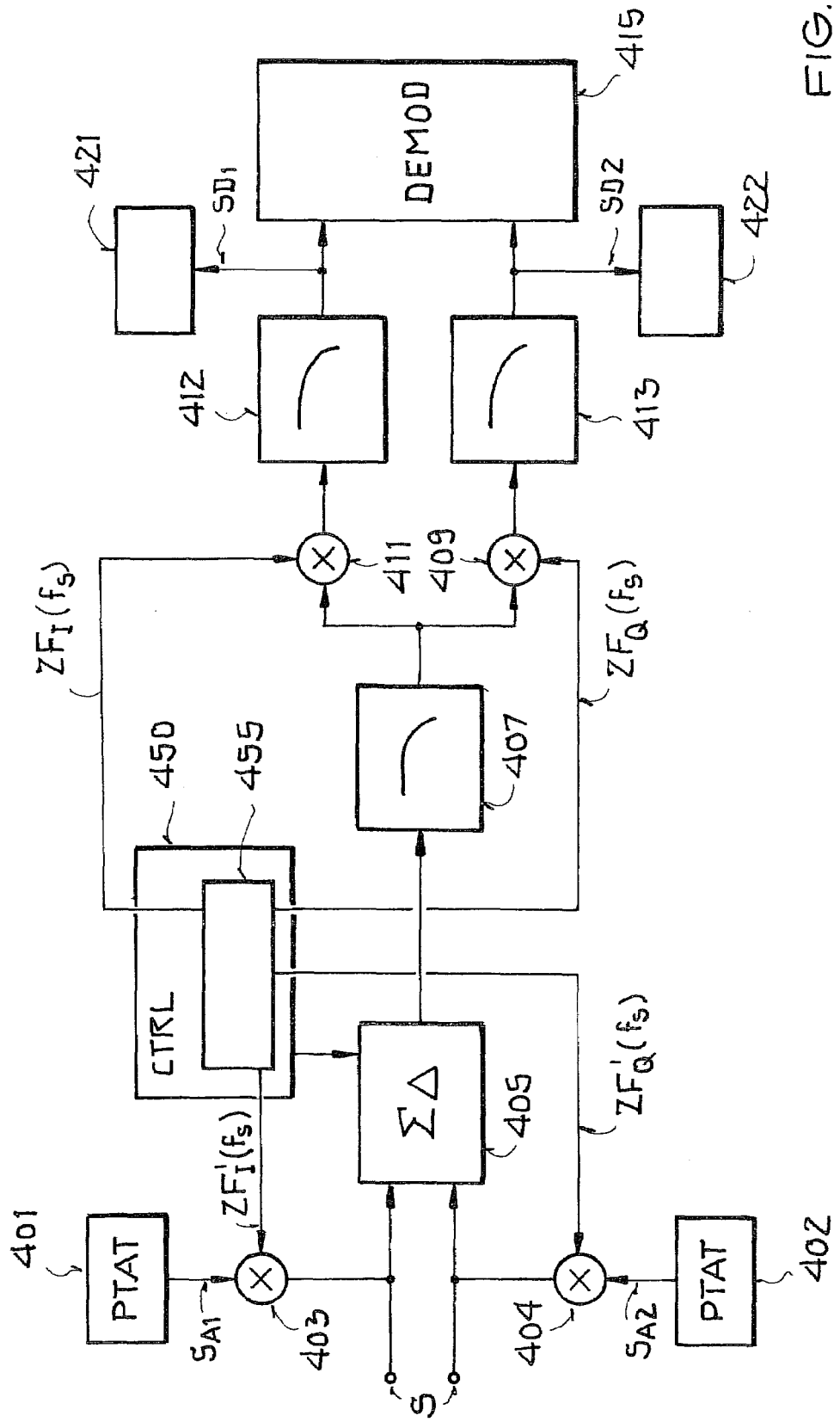
FIG. 4 shows a schematic block diagram of a communication device.

FIG. 4 shows a communication device with a signal generator 401 (e.g., PTAT signal generator) to generate an analog DC voltage signal $s_{A1}$, to which an analog frequency converter 403, e.g., an analog mixer, is connected downstream. The mixer output is connected to a first input of an analog-to-digital converter 405, e.g., a sigma-delta converter. The analog-to-digital converter 405 further has a second input. A received signal s can be applied in addition at both inputs. An output of analog-to-digital converter 405 is connected to a filter 407, e.g., a decimation filter or lowpass filter controllable by means of control unit 450. A filter 412, e.g., a lowpass filter, is connected downstream of a first digital frequency converter 411. A filter 413, e.g., a lowpass filter, is connected downstream of a second digital frequency converter 409. The outputs of filters 412 and 413 are connected, e.g., to a demodulator 415 (DEMOD) for demodulating the received signal s.

The second input of analog-to-digital converter 405, moreover, is connected to an output of another analog mixer 404. The additional analog mixer 404 is connected to another signal generator 402, which generates another analog DC voltage signal $S_{A2}$. Mixers 403, 404 are supplied by oscillator device 455 with a first oscillator signal $ZF'_Q(fs)$, $ZF'_I(fs)$. In contrast, mixers 411 and 409 are supplied by oscillator device 455 with a second oscillator signal $ZF_Q(fs)$, $ZF_I(fs)$. Due to the respective phase difference of the parts by 90°, both analog DC voltage signals $s_{A1}$ and $s_{A2}$ can be converted simultaneously in an analog-to-digital manner and after the lowpass filtering by lowpass filters 412 and 413 evaluated in parallel by evaluation units 421 and 422. In this case, it is only necessary that the oscillator signals $ZF_Q(fs)$, $ZF_I(fs)$ and $ZF'_Q(fs)$, $ZF'_I(fs)$ of oscillator device 455 are of the same frequency fs and phase-locked to one another.

The exemplary embodiment of FIG. 4 can be refined further by providing other analog frequency converters (not shown) via analog mixers 403 and 404. Furthermore, a multiplexer (not shown) is provided, which can be controlled by control unit 450. The multiplexer is formed and wired for switching the first oscillator signal $ZF'_Q(fs)$, $ZF'_I(fs)$ to mixers 403, 404 and the other analog frequency converters. Thus, a higher number of sensor signals can be converted analog-to-digital by selection by the multiplexer.

Analog frequency converter 403 transforms the output signal of signal generator 401, e.g., to an intermediate frequency, whereby the transformed signal is decimated after filtering. Digital mixers 411, 409 are controlled in such a way that the signals applied at the mixers are again transformed, e.g., into baseband.

A received signal s, which can be received by a receiving circuit, can be applied, for example, at the two inputs of analog-to-digital converter 405. Thus, analog-to-digital converter 405 can convert, e.g., the received signal in the original frequency position and/or the output signal of signal generator 401, which can supply a measuring signal. The control of digital mixers 411 and 409 can thereby be different or the same for the received signal and for the output signal of signal generator 401.

Figure 5:
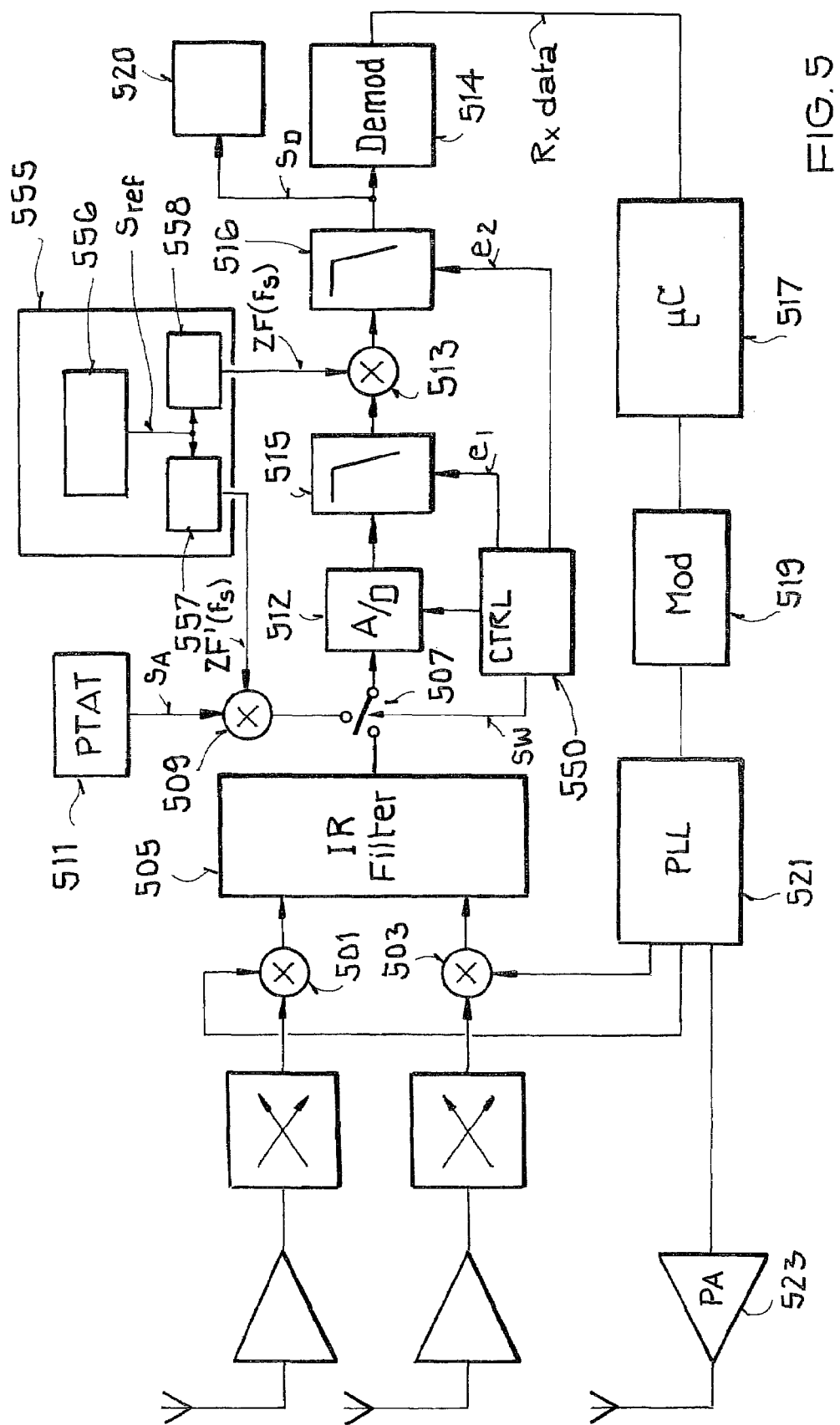
FIG. 5 shows a schematic block diagram of a communication device.

FIG. 5 shows a schematic block diagram of a communications device with a first analog frequency converter 501 and a second analog frequency converter 503 of a receiving circuit. The outputs of analog frequency converters 501 and 503 are connected to a filter 505, e.g., an IF (Intermediate frequency) filter. An output of filter 505 is connected to a first terminal of a switch 507, for example, a transistor switch or multiplexer. The switch further has a second terminal to which an output of a third analog frequency converter 509 is connected. An input of third analog frequency converter 509 is connected to an output of a signal generator 511, e.g., a PTAT or a pressure measuring signal generator.

Another terminal of switch 507 is connected via an analog-to-digital converter 512 (A/D) to a decimation filter 515. An output of decimation filter 515 is connected, e.g., via a digital mixer 513 and via a lowpass filter 516 and via a demodulator 514 (Demod) to an input of a microcontroller 517 (μC), whose output is connected to a modulator 519 (Mod). An output of modulator 519 is connected to a PLL circuit 521 (Phase-Locked Loop). PLL circuit 521 has outputs that are connected to the control inputs of analog frequency converter 501 and 503 of the receiving circuit. Another output of PLL circuit 521 is connected via a power amplifier 523 (PA: Power Amplifier), e.g., to an antenna.

The received signals receivable via the receive antennas shown in FIG. 5 are down-mixed after amplification by analog mixers 501 and 503 and supplied to filter 505. If switch 507 is in the first position, the filter output signal is converted in an analog-to-digital manner and supplied to decimation filter 515, whereby an output signal of decimation filter 515 is processed further as shown in FIG. 5.

If switch 507 is in a second switch position, a DC voltage output signal $s_A$ of signal generator 511, transformed by analog frequency converter 509, is supplied to decimation filter 515, which after the analog-to-digital conversion is supplied to decimation filter 515. Decimation filter 515 is thereby controlled, e.g., by a control unit 550 by means of control signal $e_1$ to set the corner frequencies of decimation filter 515. As a result, the bandwidth of the bandpass effect, generated by filters 515 and 516 and digital mixer 513, for the second switch position of switch 507 for the analog DC voltage signal $s_A$ of signal generator 511 can be drawn especially narrow.

Digital mixer 513 transforms the input signal here in such a way that, after an optional lowpass filtering through filter 513, an output signal of filter 513 represents the digitized output signal $s_D$ of signal generator 511. As a result, e.g., the measurement results are not affected by the noise of the amplifier provided in analog-to-digital converter 512. The digital signal $s_D$ is branched off the receive path and evaluated in evaluation unit 520, which can be formed especially simply because only direct components are to be evaluated.

Further, control unit 550 can be provided to control switch 507 by a control signal sw; it switches switch 507 either in the first or in the second switch position and depending on this sets the corner frequencies of filters 515 and 516. Furthermore, an oscillator device 555 is provided, which outputs a first oscillator signal $ZF'(fs)$ to analog mixer 509 and a second oscillator signal $ZF(fs)$ to digital mixer 513. So that both oscillator signals $ZF'(fs)$ and $ZF(fs)$ have the same frequency fs and are phase-locked to one another, oscillator device 555 has a reference unit 556 or a terminal for reference unit 556, for example, an oscillating circuit, which generates a reference signal sref. Furthermore, oscillator device 555 has a frequency divider 557 to generate a rectangular signal as the first oscillator signal $ZF'(fs)$ and a converter 558 to generate a signal form, approaching a sine or cosine form, as the second oscillator signal $ZF(fs)$.

Figure 6:
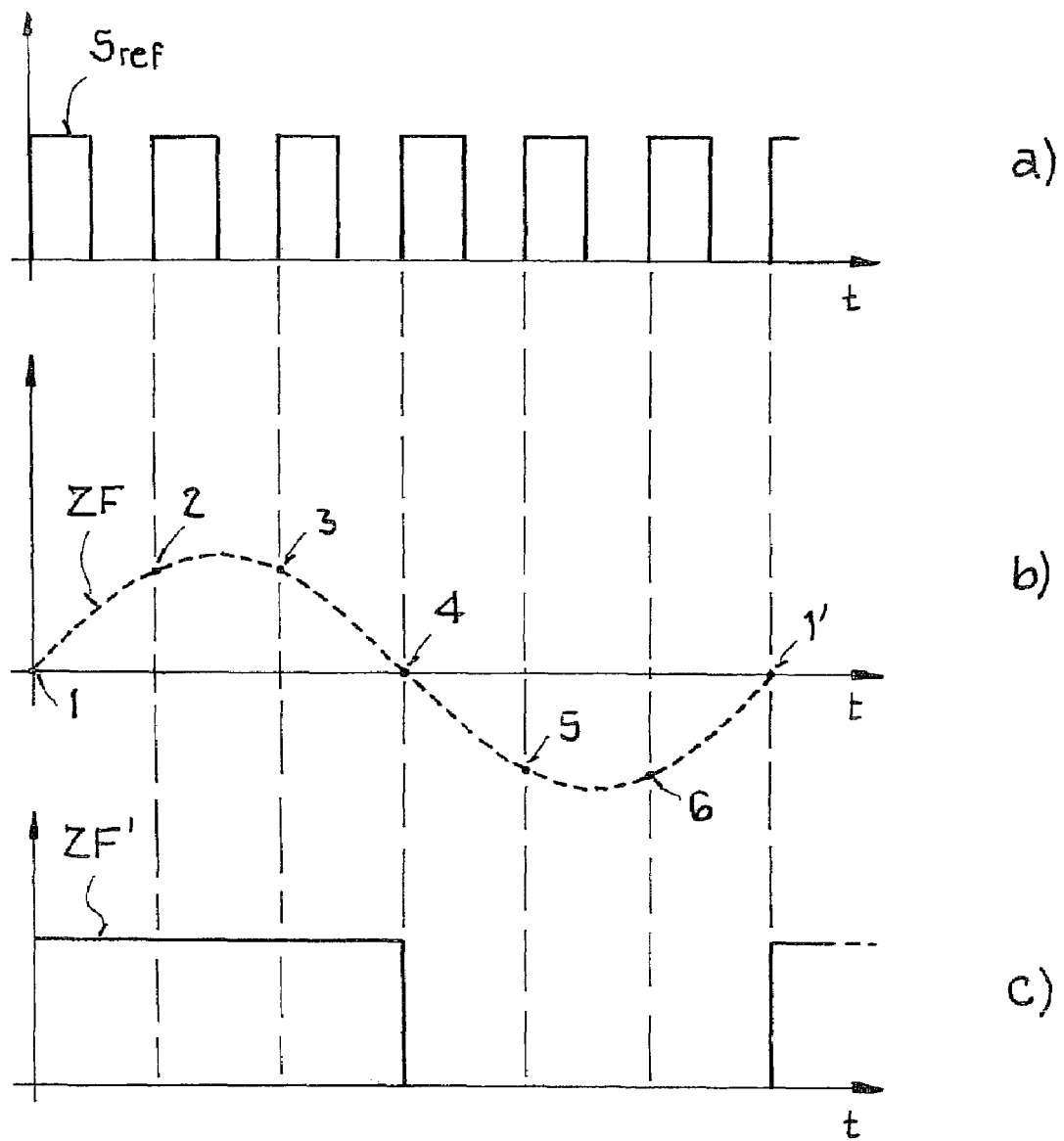
FIG. 6 shows a schematic diagram with oscillator signals.

Examples for the first oscillator signal $ZF'(fs)$ and the second oscillator signal $ZF(fs)$ are shown in FIG. 6 as a schematic diagram. The reference signal sref, the first oscillator signal $ZF'(fs)$, and the second oscillator signal $ZF(fs)$ are thereby plotted versus the time t. The reference signal sref is, for example, a digital clock signal, which has a rectangular form. The first oscillator signal $ZF'(fs)$ is synchronized to the reference signal sref and at each point in time of a rising edge of the reference signal sref has a basic value 1, 2, 3, 4, 5, 6, 1', whereby the position of the basic value approaches a sine form, indicated by the dashed line in FIG. 6. The second oscillator signal $ZF(fs)$ is obtained by 1:6 division from the reference signal. Rising and falling edges of the second oscillator signal $ZF(fs)$ coincide here with the zero passages of the first oscillator signal $ZF'(fs)$, so that both signals have the same frequency and are phase-locked to one another. In the exemplary embodiment of FIG. 6, both phase positions of the first oscillator signal $ZF'(fs)$ and the second oscillator signal $ZF(fs)$ are even identical.

The invention is not limited thereby to the shown exemplary embodiments in FIGS. 1 through 6. Thus, the person skilled in the art can apply the converter concept in a simple way to other sensor types and other DC voltage signals of other sources.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A transducer device for converting an analog DC voltage signal into a digital signal, the transducer device comprising:
   an oscillator device for outputting a first oscillator signal and a second oscillator signal, the oscillator device configured to generate the first oscillator signal and the second oscillator signal phase-locked to one another and with the same frequency from a reference signal;
   an analog frequency converter operatively connected to the oscillator device for transforming the analog DC voltage signal via the first oscillator signal in a first spectral range with a first center frequency to obtain a transformed signal;
   an analog-to-digital converter for converting the transformed signal into a transformed digital signal; and
   a digital frequency converter operatively connected to the oscillator device for transforming the transformed digital signal by the second oscillator signal in a second spectral range with a second center frequency to obtain the digital signal.

2. The transducer device according to claim 1, wherein the reference signal has a higher frequency than the first and second oscillator signal, particularly an integer multiple of the frequency of the first and second oscillator signal.

3. The transducer device according to claim 1, wherein signal values of the second oscillator signal within a period of the second oscillator signal approximately depict a sine or cosine form.

4. The transducer device according to claim 1, further comprising a plurality of digital filters operatively connected to the digital frequency converter to form a filtering of an analog 1/f noise.

5. The transducer device according to claim 1, wherein the digital frequency converter is a baseband mixer.

6. The transducer device according to claim 1, further comprising a switch for switching an output of the analog frequency converter to an input of the analog-to-digital converter.

7. The transducer device according to claim 6, wherein the switch, in a first switch position, switches the output of the analog frequency converter to the input of the analog-to-digital converter and, in a second switch position, switches another terminal to the input of the analog-to-digital converter, and wherein a transmitted signal, particularly an up-mixed signal, or received signal, particularly a down-mixed signal, is applied at the other terminal.

8. The transducer device according to claim 7, further comprising:
   a number of digital filters connected to the digital frequency converter; and
   a control unit, which is set up for setting corner frequencies of the respective filter, the frequencies being based on the first switch position or the second switch position.

9. The transducer device according to claim 1, further comprising a decimation filter connected downstream of the digital frequency converter.

10. The transducer device according to claim 1, further comprising a lowpass filter connected downstream of the digital frequency converter.

11. The transducer device according to claim 1, wherein the digital frequency converter has a first digital mixer for applying an in-phase part of the second oscillator signal and a second mixer to apply a quadrature-phase part of the second oscillator signal, and wherein the analog frequency converter has a first mixer for applying a first signal part of the first oscillator signal with the same phase position as the in-phase part of the second oscillator signal and a second mixer to apply a second signal part of the first oscillator signal with the same phase position as the quadrature-phase part of the second oscillator signal.

12. A receiving device comprising the transducer device according to claim 1, wherein the analog-to-digital converter comprises an optionally selectable input for receiving a received signal.

13. A method for converting an analog direct voltage signal into a digital signal, the method comprising:
   generating a first oscillator signal and a second oscillator signal from a reference signal by an oscillator device, the first oscillator signal and the second oscillator signal being phase-locked to one another and having a similar frequency;
   transforming the analog DC voltage signal by an analog frequency converter that is connected to the oscillator device based on the first oscillator signal in a first spectral range with a first center frequency to obtain a transformed signal;
   converting the transformed signal by an analog-to-digital converter into a converted digital signal; and
   transforming the transformed digital signal by a digital frequency converter that is connected to the oscillator device based on the second oscillator signal in a second spectral range with a second center frequency to obtain the digital signal.

* * * * *